United States Patent
Abramovici et al.

(10) Patent No.: US 7,305,635 B1
(45) Date of Patent: Dec. 4, 2007

(54) SERIAL IMPLEMENTATION OF ASSERTION CHECKING LOGIC CIRCUIT

(75) Inventors: Miron Abramovici, Berkeley Heights, NJ (US); Gerard Philippe Memmi, Cambridge, MA (US)

(73) Assignee: DAFCA, Inc., Framingham, MA (US)

( * ) Notice: Subject to any disclaimer, the term of this patent is extended or adjusted under 35 U.S.C. 154(b) by 377 days.

(21) Appl. No.: 11/051,774

(22) Filed: Feb. 4, 2005

(51) Int. Cl.
  *G06F 17/50* (2006.01)
(52) U.S. Cl. .................................. 716/4; 716/2; 716/6
(58) Field of Classification Search .............. 716/1, 716/2, 4, 6, 18
  See application file for complete search history.

(56) References Cited

U.S. PATENT DOCUMENTS 7,137,086 B2 * 11/2006 Abramovici ................... 716/4

* cited by examiner

*Primary Examiner*—Thuan Do
(74) *Attorney, Agent, or Firm*—Henry T. Brendzel (57) ABSTRACT

Serial assertion checking is realized in a System On a Chip (SoC) device by connecting scan chain output to a bit extractor configured within a functionally reconfigurable module that is part of the SoC, which extracts the bits necessary for the assertion checking. The extracted bits are applied to a finite state machine that implements the assertion checking.

22 Claims, 9 Drawing Sheets

SERIAL IMPLEMENTATION OF ASSERTION CHECKING LOGIC CIRCUIT

RELATED APPLICATION

This application is related to U.S. patent application Ser. No. 10/956,854, filed Oct. 1, 2004, which is hereby incorporated by reference.

BACKGROUND

This invention relates to integrated circuits and, more particularly, to functional testing and debugging of integrated circuit designs.

The 10/956,854 patent application discloses a beneficial design approach for System on a Chip (SoC) devices, where each core is encompassed with a wrapper that includes a functionally reconfigurable module (FRM). The advance in the art disclosed in the 10/956,854 patent application incorporates configurable circuits within the FRM that perform assertion checking.

In assertion checking, a collection of conditions is identified which conditions are expected to hold true during the operation of a properly working SoC. To perform assertion checking, the tested SoC receives various input test vectors, and the resulting SoC states are checked against a collection of assertions. Assertion checking can be of two types: "at-speed" assertion checking, and "single-step" assertion checking. In at-speed assertion checking all of the inputs and outputs of a core are available, in parallel, to the assertion checking circuitry within the FRM. The logic for performing the assertion checking is responsive to some or all of these signals, and this logic operates in parallel. In single-step assertion, the internal flip-flops of the SoC are connected to form a scan chain (the circuitry for forming the scan chain having been included in the SoC design in accord with conventional design practices), the data of the formed scan chain is clocked out, and the information thus obtained is analyzed to determine whether any of the assertions fire.

The 10/956,854 patent application also disclosed the Continuous Single Step (CSS) mode, which makes possible automatic checking such assertions after every functional clock. That is, the SoC under test is activated in its normal mode (mode A) for a single period of the operational clock, and then moved to its assertion checking mode (mode B). During the assertion checking mode the scan chain is formed, the data are outputted and captured (and reinserted, to return the circuit to its operational state), and tested against the set of assertions. If none of the assertions fires, the SoC is again activated in its normal state for one period of the operations clock, and then again moved to its assertion checking mode.

Figure 1:
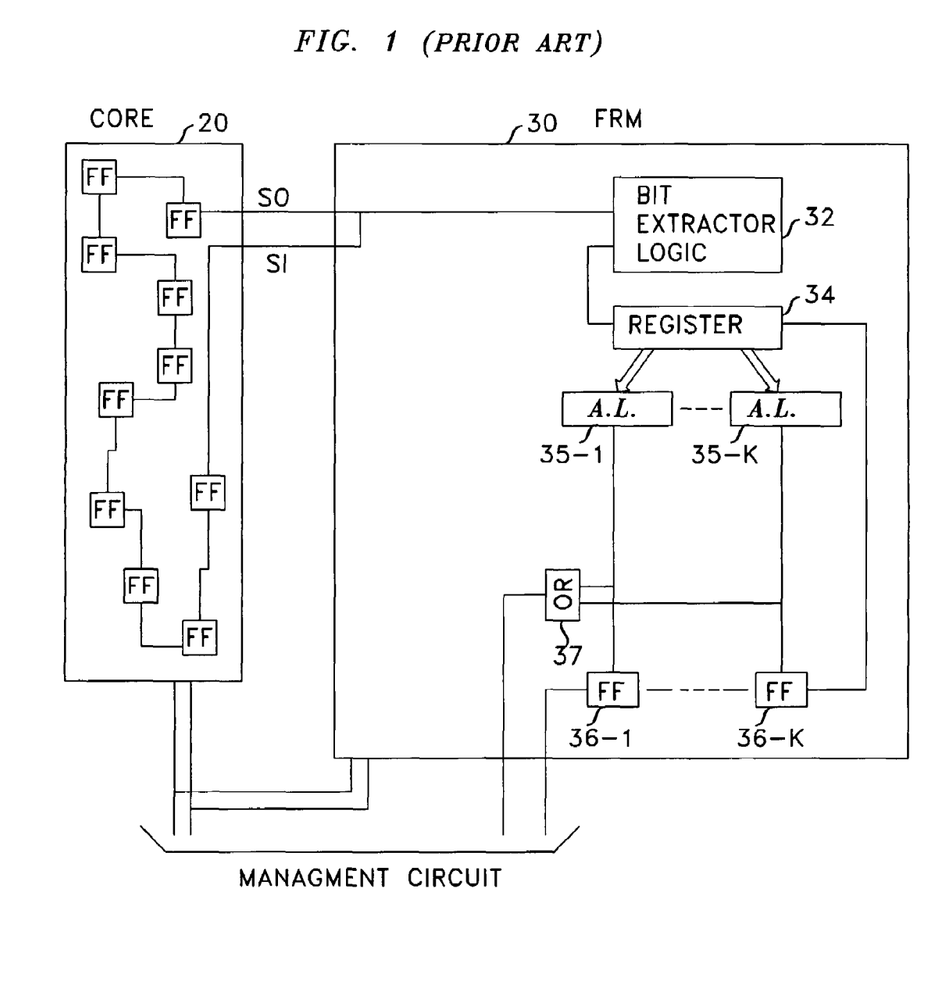
FIG. 1 shows the circuitry in an FRM of an SoC for CSS assertion checking.

FIG. 1 shows a core 20 of an SoC and its associated FRM 30. Core 20 is shown to receive two control signals from a management circuit (not shown), one of which configures the flip-flops within core 20 into a chain scan (as depicted in the FIG.), and the other provides a clock. The clock signal causes the states of the flip-flops to appear at the SO output, and those states applied to both the SI input and bit extractor 52. The duration of the clock is set to restore core 20 to the state it was in before commencement of the clock.

It should be understood that a core can be designed to comprise more than one scan chain, with a plurality of SO outputs and SI inputs, although FIG. 1 shows only one scan chain for sake of simplicity. It should be further understood in the context of this disclosure that although one scan chain is shown, as well as one bit extractor and one set of circuits responsive to the bit extractor, in FIG. 1 as well as in subsequent FIGS. a plurality of scan chains might be employed, in which case a plurality of bit extractors and corresponding subsequent circuits would also be employed. It is noted that a plurality of bit extractors can be combined to form a single bit extractor with a plurality of outputs, and it is also noted that a plurality of scan chains can be outputted via a single output terminal of a core, thus effectively outputting the various scan chains in a seriatim manner. In such a case, a single bit extractor may suffice.

As for the structure of bit extractor 32, skilled artisans would recognize that there are numerous ways to implement a bit extractor. One very simple way is to configure an addressable memory that stores the numbers of the identified sequence; for example, the memory might be uploaded with the values 5, 28, . . . 111. Within the bit extractor there might be a counter A that advances with each test clock, a counter B that addresses the memory, and a comparator responsive to the output of the memory and to counter A. Thus, when the first entry of the memory is retrieved (e.g., 5), the comparator fires when counter A reaches the value 5, indicating that the fifth bit of the scan chain is available, at which time the available bit is presented to the output of bit extractor 32. At that time counter B is incremented, advancing the address and causing the memory to output its second entry, i.e., 28. The process continues until the $28^{th}$ bit arrives and it is outputted, etc.

Under control of bit extractor logic 32, selected bits of the Scan Output (SO) are stored in register 34. Those bits are applied to Assertion Logic (AL) circuits 35-1 through 35-K, each of which checks one assertion. The outputs of the AL circuits are stored in respective flip-flops 36-1 through 36-K, and those flip-flops are interconnected to provide a serial output of their contents to the management circuit. The serial output of register 34 is connected to flip-flop 36-1, which allows the management circuit to receive and additionally analyze the bits collected by extractor logic 32. Finally, the outputs of the AL circuits are also applied to OR gate 37 that provides an indication to the management circuit as to whether any of the assertions fired. Of course, the management circuit includes means to output various signals to the user who is exercising the SoC and means to stop the functional clock when an assertion fires. The management circuit is not shown because its design depends on the particular choices that may be made in connection with specific SoCs, or in connection with the goals set for simulating an SoC, and such designs do not form a part of this invention. However, it should be realized that both in connection with the FIG. 1 circuit in connection with the other FIGS. a management circuit is included for controlling operation of the circuits embodying the concepts of this invention and for outputting results of the assertion checking.

There are significant advantages to circuit disclosed in FIG. 1, but it is noted that the assertion logic circuits operate in parallel, therefore the amount of logic they require depends of the number of extracted bits and these circuits potentially can take up a significant amount of FRM "real estate."

SUMMARY

An advance in the art is realized by checking assertions serially, as the bits are captured from each Scan Output lead of a core under control of an associated bit extractor logic element. The captured bits are applied to a finite state machine comprising a combinatorial logic circuit responsive to the captured SO bits and to one or more output of a memory module that receive inputs from one or more outputs of the combinatorial logic circuit. Additionally, signals available from the memory module and/or from the logic circuit are applied to a second combinatorial logic circuit that develops a signal representing the result of the assertion checking.

DETAILED DESCRIPTION

As described in the aforementioned Ser. No. 10/425,101 application, an FRM can be realized with field-programmable logic arrays (FPLAs) in a conventional manner, and the variety of digital circuits that can be created within an FPLA is essentially limitless. We realized and discovered that this powerful structure can be applied to provide a novel solution to the problem of efficiently implementing assertion checking in hardware by creating assertions in the reconfigurable logic contained in wrappers. By repeatedly reusing the reconfigurable logic within the FRMs to implement different subsets of assertions, one subset of assertions at a time, all of the necessary assertions can be checked. Advantageously in accord with the principles disclosed herein, all of the assertions of a subset are checked concurrently.

Figure 2:
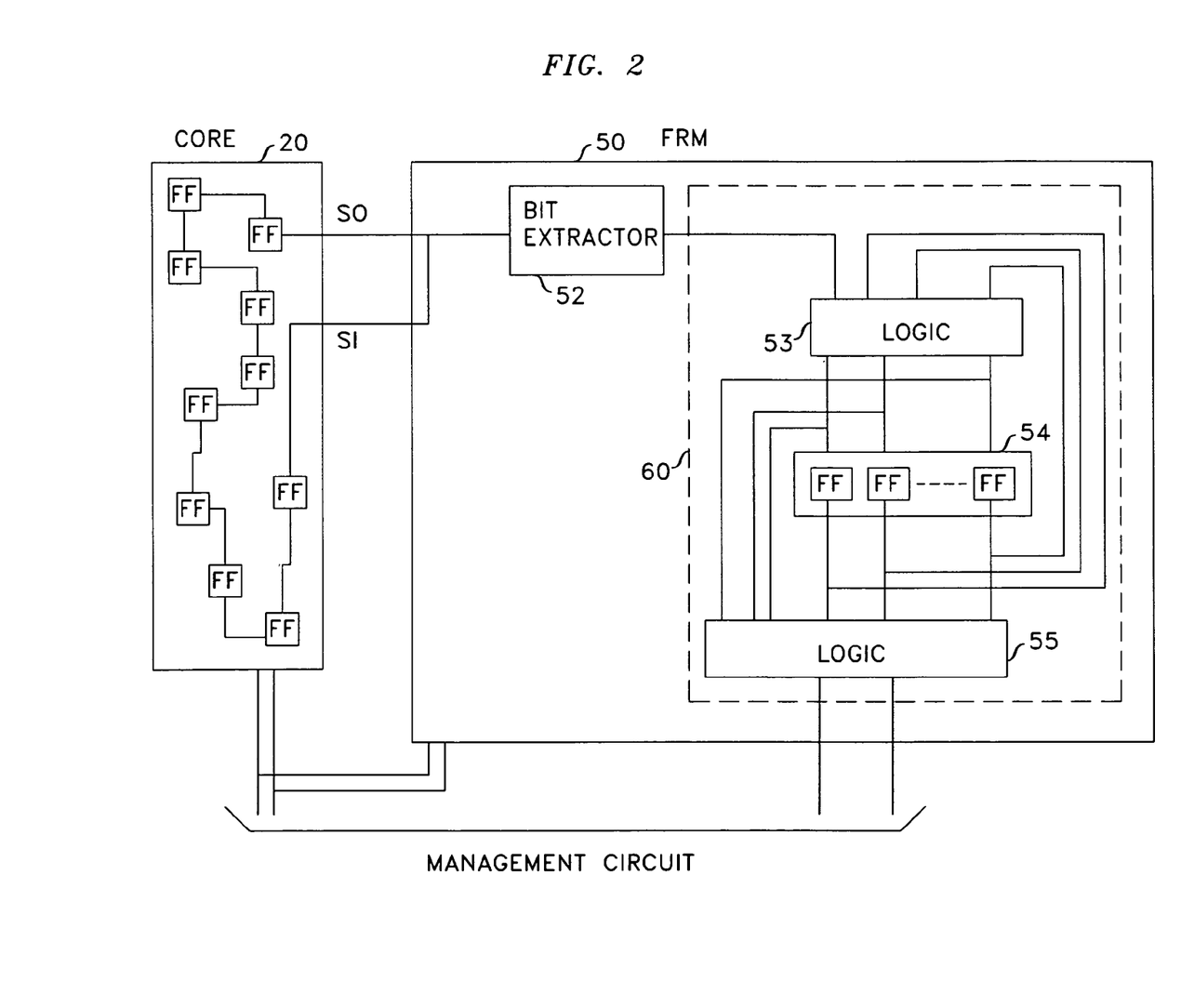
FIG. 2 depicts an arrangement in accord with the principles disclosed herein.

FIG. 2 presents one illustration of assertion checking circuit in accord with the present disclosure. As in the FIG. 1 arrangement, FIG. 2 depicts a core 20 with a SO output that is coupled to an SI input and to bit extractor 52. Bit extractor 52 outputs the bits captured from the SO output to logic circuit 53. Logic circuit 53 is a combinatorial circuit with one or more outputs that are applied to a set of flip-flops that form memory module 54. The outputs of the flip-flops are fed back to logic circuit 53, and thus circuit 53 and memory module 54 form a classic finite state machine (or a sequential circuit). The outputs of logic circuit 53 and the outputs of memory module 54 are applied to combinatorial logic circuit 55 to form one or more output signals that informs whether the assertion checked by the sequential circuit has fired or not, or some other condition. The combination of logic circuit 53, memory module 54, and logic circuit 55 can be viewed as a single sequential circuit 60. The advantage of the serial implementation of assertion checking is that the required circuit is much smaller than the parallel implementation of the same assertion; moreover, the amount of logic required by the serial implementation does not depend on the number of the bits extracted.

Figure 3:
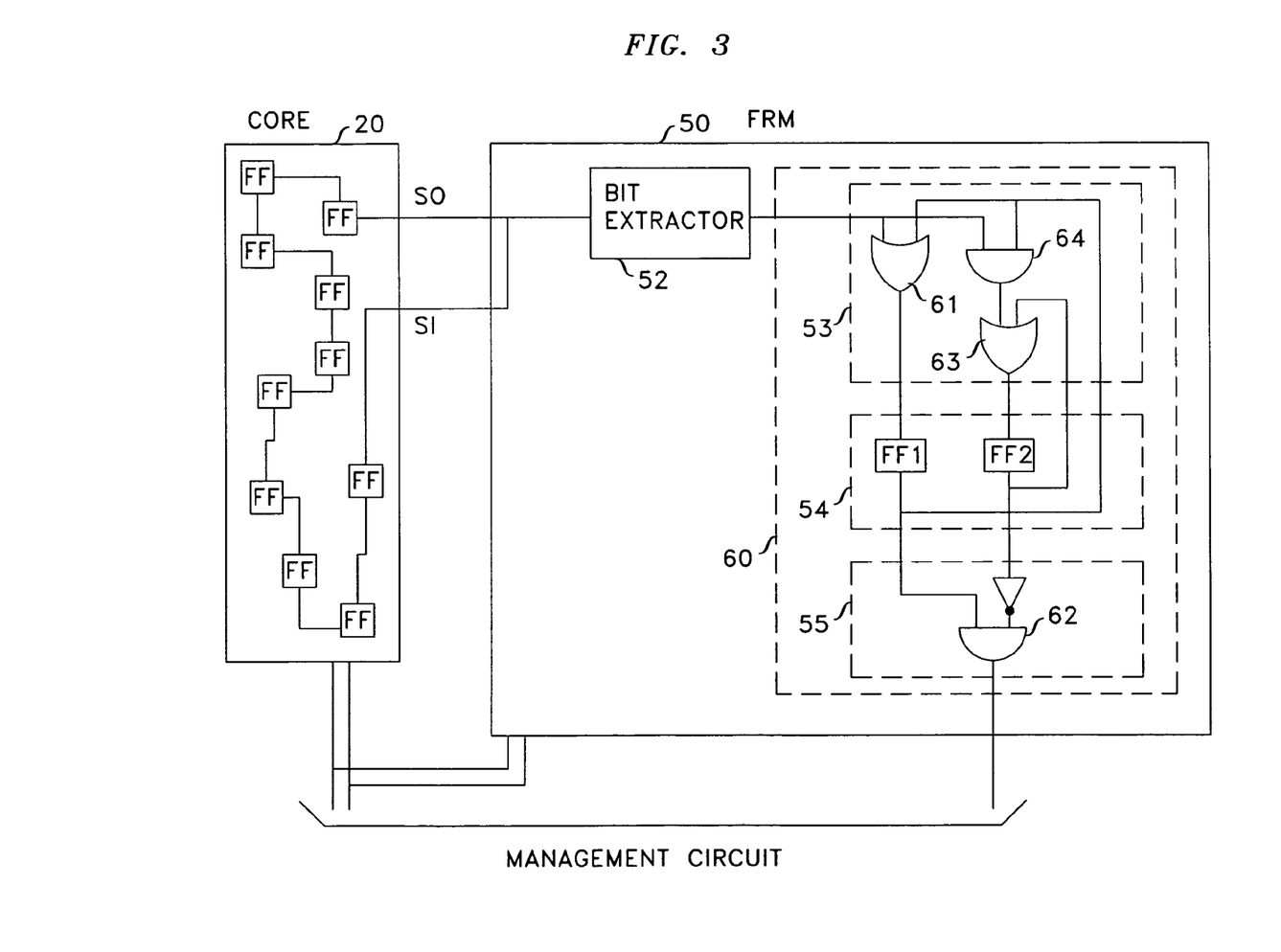
FIG. 3 illustrates a "one-hot" assertion checking embodiment.

FIG. 3 presents a specific embodiment where the assertion tested specified that one and only one bit of a set of extracted bits should be at logic level 1 ("1"). This is also called "one-hot" property. When the specified condition is not satisfied, we say that the assertion has fired. With a serially applied input, it is clear that a flip-flop is needed to indicate whether at least one of the bits extracted so far has been "1." This is the function of the flip-flop FF 1 which starts at "0" (the reset signal is not shown for simplicity of the drawing) and it is set on the arrival of the first "1;" then FF 1 remains locked in this state (until reset for another assertion check), because of the feedback loop through the OR gate 61. A second flip-flop is necessary to indicate that at least two bits with value "1" have been extracted; this is the flip-flop FF2, which starts at "0" and it is set to on the arrival of the second "1;" FF2 remains locked in this state (until reset) because of the feedback loop through the OR gate 63. Accordingly, the memory module 54 of FIG. 3 has two flip-flops. The combinatorial logic circuit 53 includes merely an AND gate and two OR gates, and the combinatorial logic circuit 55 includes an inverter and an AND gate. When, after all needed bits have been extracted, FF1 is at "1" (at least one bit was "1") and FF2 is at "0" (the second "1" bit never came), one can conclude that the condition of the assertion has been satisfied, or that the assertion is True. This condition is detected by the AND gate 62 where an output that is at "0" indicates that the assertion has fired.

If the output of bit extractor 32 at time t is designated by $A^t$, the output of FF1 at time t is designated by $Q_1^t$, the output of FF2 at time t is designated by $Q_2^t$, and the output of gate at time t is designated by 62 by $O^t$, it is clear that the relationships in FIG. 3 are as follows:

$$Q_1^{t+\Delta}=A^t+Q_1^t$$

$$Q_2^{t+\Delta}=A^tQ_1^t+Q_2^t \text{ and}$$

$$O^t=Q_1^t\overline{Q_2^t}.$$

where $\Delta$ is the clock period.

Figure 4:
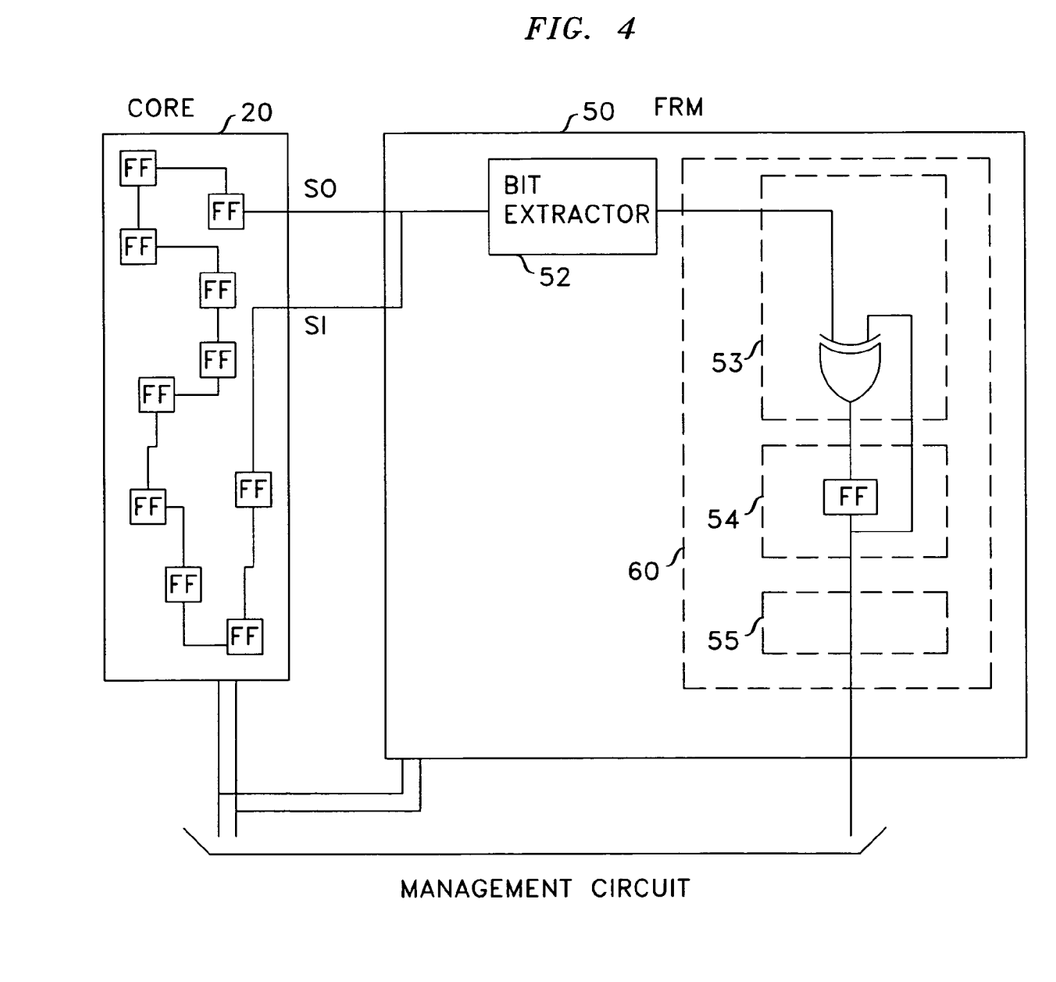
FIG. 4 illustrates a parity assertion checking circuit; . . .

FIG. 4 illustrates a parity checker. It merely requires an Exclusive OR gate within circuit 53 that is responsive to bit extractor 52 and to the output of the one flip-flop within circuit 54. Circuit 55 is empty. In operation, the flip-flop is reset to output a "0" and that output stays until the first "1" appears at the output of bit extractor 52, whereupon the flip-flop is set to a "1." Thereafter, the flip-flop continually outputs a "1" until the appearance of another "1" at the output of bit extractor 52, whereupon the flip-flop is set to a "0." The operation thus continues and, at the termination of the operation, the state of the flip-flop provides the Exclusive OR of all the extracted bits. To implement an odd parity checker, the flip-flop output is the assertion output; for an even parity checker, the assertion output is provided by the complemented flip-flop output.

Using the nomenclature employed above, the relationships in FIG. 4 are as follows:

$$Q^{t+\Delta}=A^t \oplus Q^t \text{ and}$$

$$O^t=Q^t.$$

Figure 5:
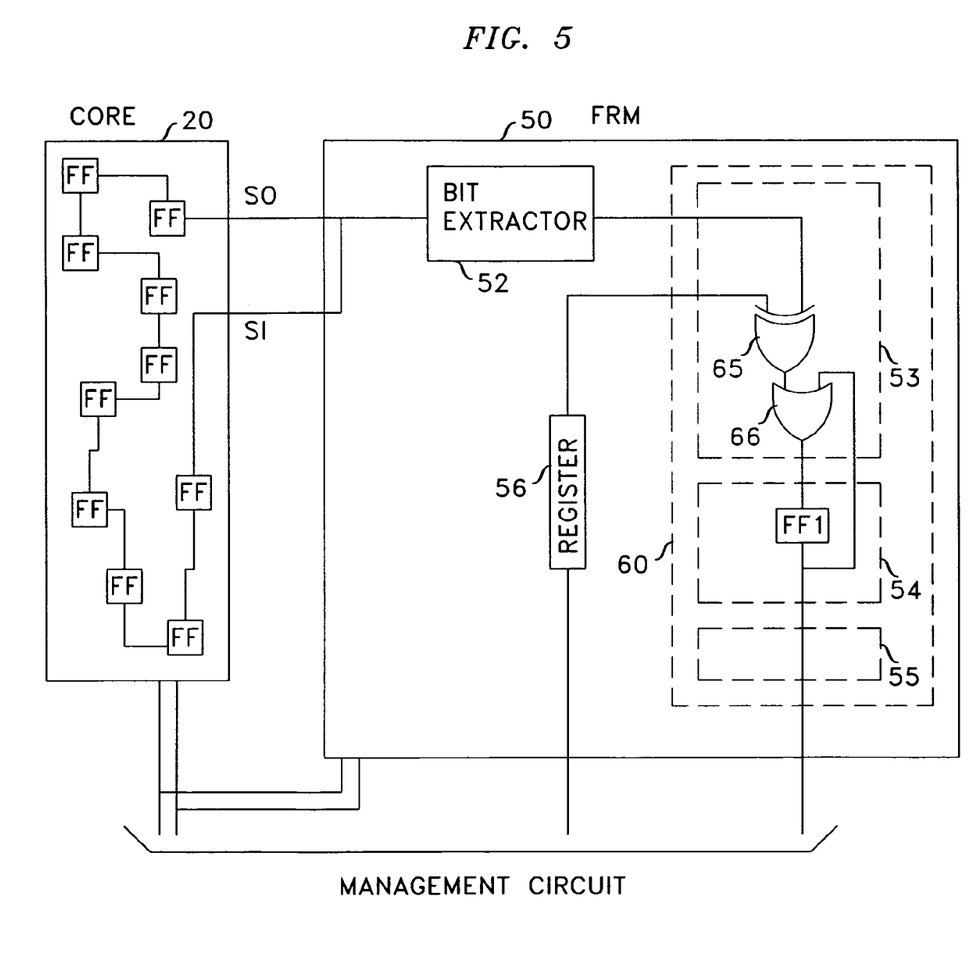
FIG. 5 illustrates an equality checking assertion checking embodiment; . . .

The circuit of FIG. 5 implements an assertion that checks for equality between a bits string outputted by shift register 56 and the sequence of bits outputted by bit extractor 52. Logic circuit 53 merely requires an Exclusive OR gate 65 and an OR gate 66, and circuit 54 requires only a single flip-flop. Circuit 55 is empty. In operation, as long as the bits applied by bit extractor 52 are the same as the bits applied by register 56, Exclusive OR gate 65 outputs a "0". Flip-flop FF1 starts at 0, and the feedback from FF1 to OR gate 66 allows the signal of OR gate 65 to pass to the input of FF1. Therefore, as long as gate 65 is at "0," FF1 remains at "0." On the occurrence of the first mismatch between a bit applied by bit extractor 52 and a bit applied by register 56, the "1" output of Exclusive OR gate 65 passes through OR gate 66 sets FF1, and FF1 is locked in the set "1" by operation of the feedback loop through OR gate 66. Thus, a "1" output of FF1 at the end of a test designates an inequality, and its complemented output (the $\overline{Q}$ output of the flip-flop) can be used to indicate a firing assertion.

It may be noted that the reference bit string may also be generated from another bit extractor or another bit extractor output, which allows the comparison to be done between two functional registers of core 20, or of different cores, whose contents may change dynamically during operation.

Using the nomenclature employed above, and adding the designator $B^t$ for a bit delivered by register 56 at time t, the relationships in FIG. 5 are as follows:

$$Q^{t+\Delta} = (A_1{}^t \oplus B^t) + Q^t \text{ and}$$

$$O^t = Q^t.$$

Figure 6:
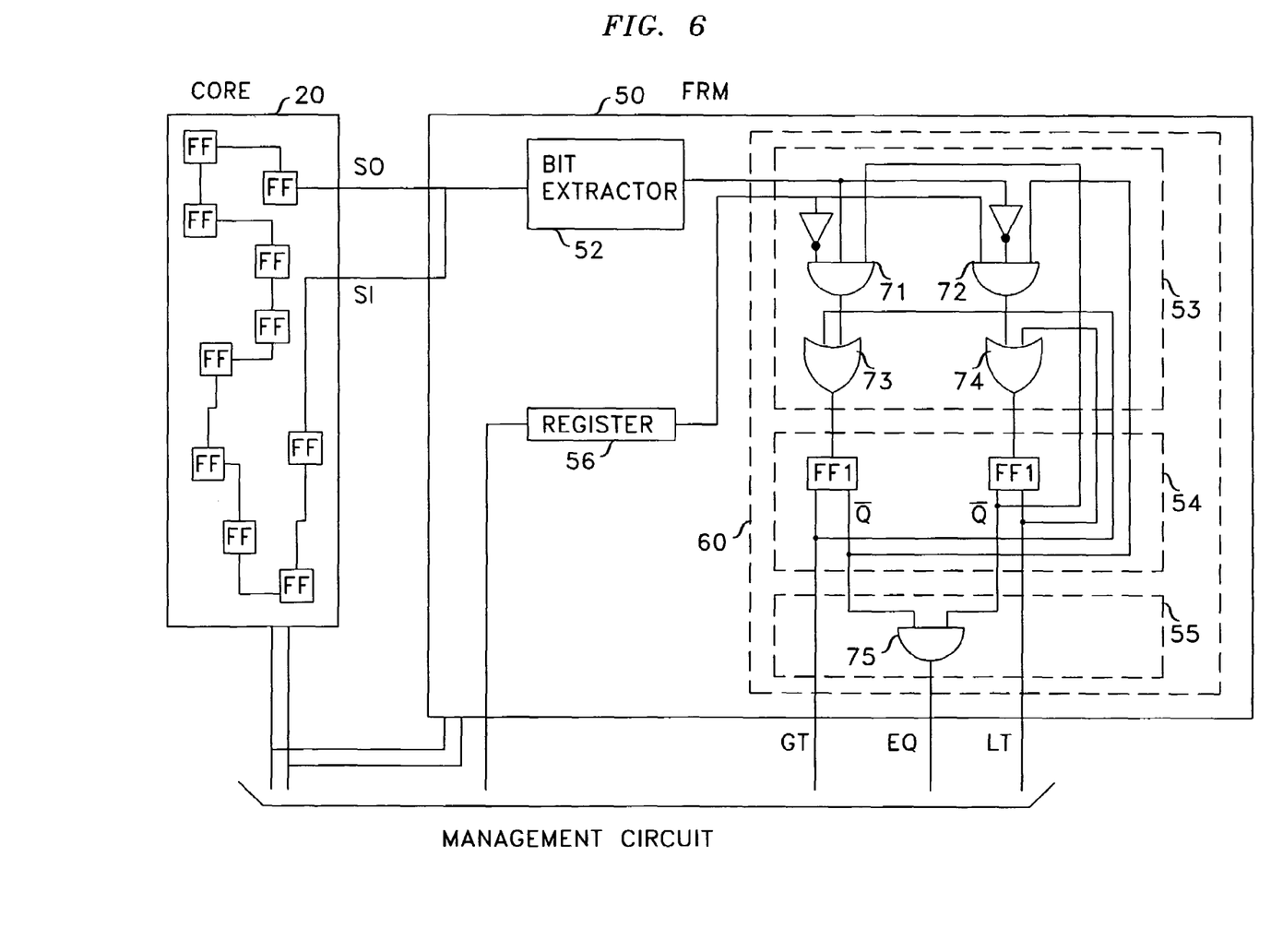
FIG. 6 illustrates an embodiment for checking "greater than," "less then" and equality assertions, when the compared numbers arrive in a most-significant-bit-first order.

FIG. 6 presents a circuit that not only checks an assertion of equality, but also provides an indication as to whether a tested number that exits bit extractor 52 (in a most-significant-bit first order) is greater than or less than a reference number that is stored in register 56 (likewise, in a most-significant-bit-first order). This circuit is somewhat more complex than the circuits described so far, but the general structure is the same; that is, there is a logic circuit 53 that includes two inverters, two AND gates, and two OR gates, a memory circuit 54 with two flip-flops, and a logic circuit 55 that includes one AND gate.

To test relationship between the tested number and the reference number, corresponding bits are compared. If the compared bits are pair-wise alike, the two numbers are equal. If they are not alike then upon a first mismatch the condition exists that the tested number at the output of extractor 52 is a "1" and the reference number at the output of register 56 is a "0" (first type of mismatch), or vice versa (second type of mismatch). The first type of mismatch indicates that the tested number is greater than the reference number, and the second type of mismatch indicates that the tested number is smaller than the reference number.

To implement the desired test, circuit 54 comprises flip-flops FF1 and FF2 that are initially set to "0," (i.e., they output "0" at their Q outputs and a "1" at their $\overline{Q}$ outputs). The Q output of FF1 is connected to the input of OR gate 73, which is connected to the input of FF1, and similarly, the Q output of FF2 is connected to the input of OR gate 74. This enables OR gates 73 and 74. The $\overline{Q}$ output of FF1 is applied to one input of AND gate 72 and, correspondingly, the $\overline{Q}$ output of FF2 is applied to one input of AND gate 71. AND gate 71 also receives a signal directly from bit extractor 52, and through an inverter from register 56. AND gate 72 also receives a signal directly from register 56 and through an inverter from bit extractor 52. AND gate 75 is responsive to the $\overline{Q}$ outputs of FF1 and FF2.

In operation, with flip-flops FF1 and FF2 starting at "0," as long as the output bits of bit extractor 52 and register 56 are the same, AND gates 71 and 72 output a "0" and so do OR gates 73 and 74. Upon the occurrence of a mismatch of the first type, AND gate 71 outputs a "1" which propagates through OR gate 73, setting FF1 to "1." FF1 remains locked in this state by operation of the feedback loop through OR gate 73. Thus FF1 is set if and only if the extracted number is greater than the reference number. The change in FF1 also disables AND gate 72, preventing FF2 from changing its "0" state. Consequently, regardless of the nature of the succeeding bits that are outputted by bit extractor 52 and register 56, FF1 is at "1" and FF2 is at "0." Consequently, the "GT" output is at "1," indicating that the tested number is greater than the reference number, and the "EQ" and "LT" outputs are at "0."

Conversely, on the occurrence of a mismatch of the second type, AND gate 72 outputs a "1" which propagates through OR gate 74, setting FF2 to "1." FF2 remains locked in this state by operation of the feedback loop through OR gate 74. Thus FF2 is set if and only if the extracted number is greater than the reference number. The change in FF2 also disables AND gate 71, preventing FF1 from changing its "0" state. Consequently, regardless of the nature of the succeeding bits that are outputted by bit extractor 52 and register 56, FF1 is at "0" and FF2 is at "1." Consequently, the "LT" output is at "1," and the "EQ" and "GT" outputs are at "0." Thus, the circuit of FIG. 6 provides signals relative to assertions that the extracted number is equal to, or greater than, or less than, the reference number.

Using the nomenclature employed above, the relationships in FIG. 6 are as follows:

$$Q_2^{t+\Delta} = Q_1{}^t + A^t \overline{B}{}^t \overline{Q}_2{}^t$$

$$Q_2^{t+\Delta} = Q_2{}^t + \overline{A}{}^t B^t \overline{Q}_2{}^t$$

$$GT^t = Q_1{}^t$$

$$LT^t = Q_2{}^t \text{ and}$$

$$EQ^t = \overline{Q}_1{}^t \overline{Q}_1{}^t.$$

Figure 7:
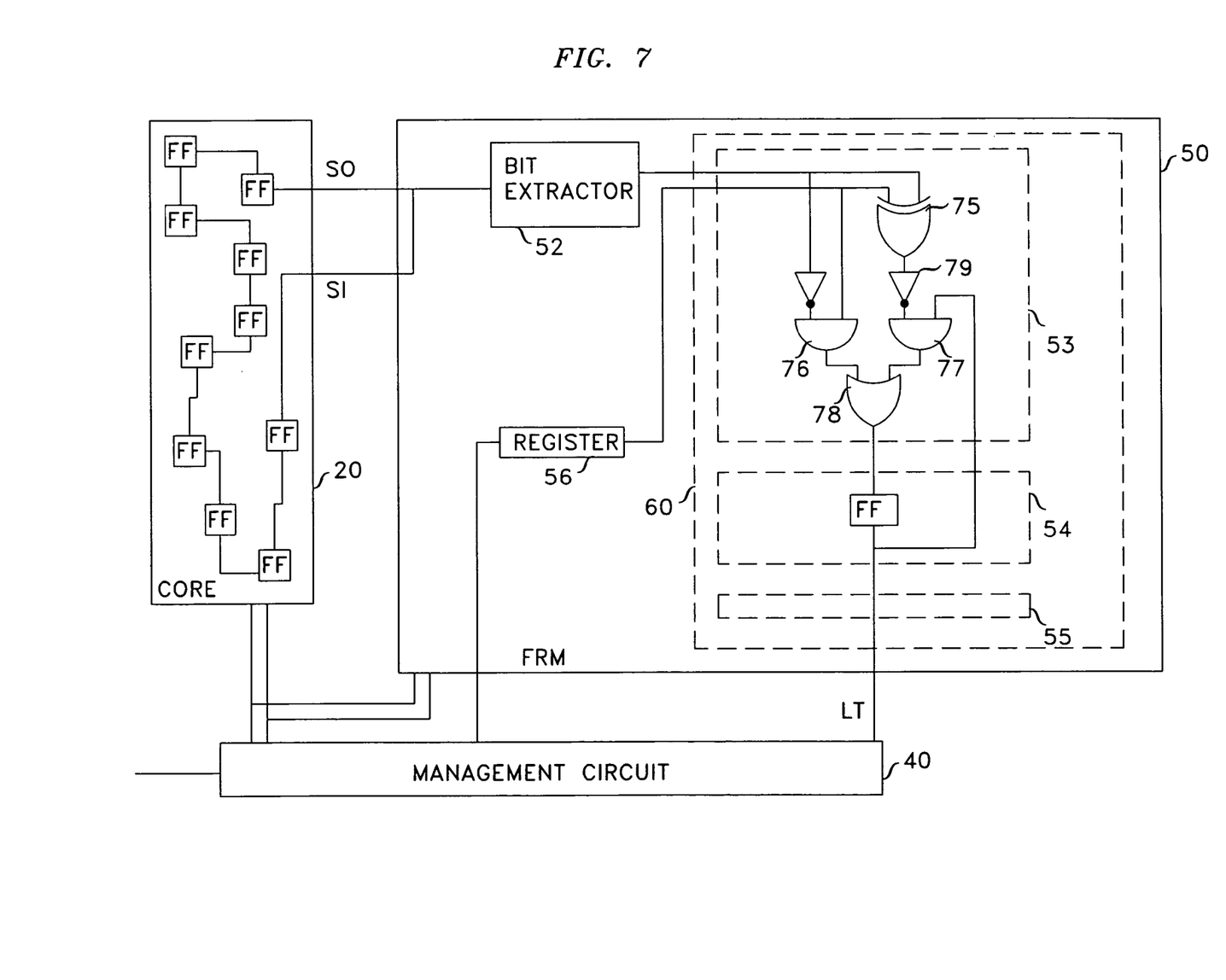
FIG. 7 illustrates a "less than" assertion checking embodiment when the compared numbers arrive in a least-significant-bit-first order.

FIG. 7 presents a circuit that performs only "less than" checking, but in connection with numbers that arrive in a least-significant-bit-first order. Circuit 53 includes AND gates 76 and 77, Exclusive OR gate 75, two invertors, and OR gate 78 whose output is applied to flip-flop FF within circuit 54. The assertion that this implementation checks states the number extracted by the bit extractor 52 is less than the reference number in the register 56. FIG. 7 explicitly depicts management circuit 40, which provides control over the operation of core 20 and FRM 50 and interface to the user who exercises core 20 through the Continuous Single Step (CSS) process in the manner disclosed herein.

In operation, flip-flop FF starts at "0" and consequently AND gate 77 is disabled. The output of AND gate 76 becomes "1" only on the occurrence of a "1" at the output of register 56 while bit extractor 52 outputs a "0." This indicates the possibility that the extractor 52 number is smaller than the register 56 number, provided that the subsequent more significant compared bits do not reverse this result. Thus, FF is set every time when the output of AND gate 76 is "1" and it represents the partial result that the assertion is true based on the comparisons done so far. If all subsequent compared bits (from bit extractor 52 and register 56) match, a conclusion can be reached that the number of register 56 is larger than the number of bit extractor 52. Whether the subsequent bit pairs match is assessed by Exclusive OR gate 75. Inverter 79, which is responsive to the output of Exclusive OR gate 75 applies a "1" to AND gate 77 as long as the compared bits match. Whenever the compared bits are different, inverter 79 applies a "0" to AND gate 77, gate 77 outputs a "0," and the value of AND gate 76 is passed through OR gate 78 to determine the next state of flip-flop FF. In this way, the last mismatch, which is the most significant, determines the final result. Consequently, if at the conclusion of the test the flip-flop is at "0," it means that the assertion has fired, as the number extracted by bit extractor 52 is not less than the reference number of register 56 (it could be equal or greater).

Using the nomenclature employed above, the relationships in FIG. 7 are as follows:

$$Q^{t+\Delta}=Q^t \overline{(A^t \oplus B^t)} + \overline{A^t} B^t \text{ and}$$

$$LT^t = Q^t$$

Figure 8:
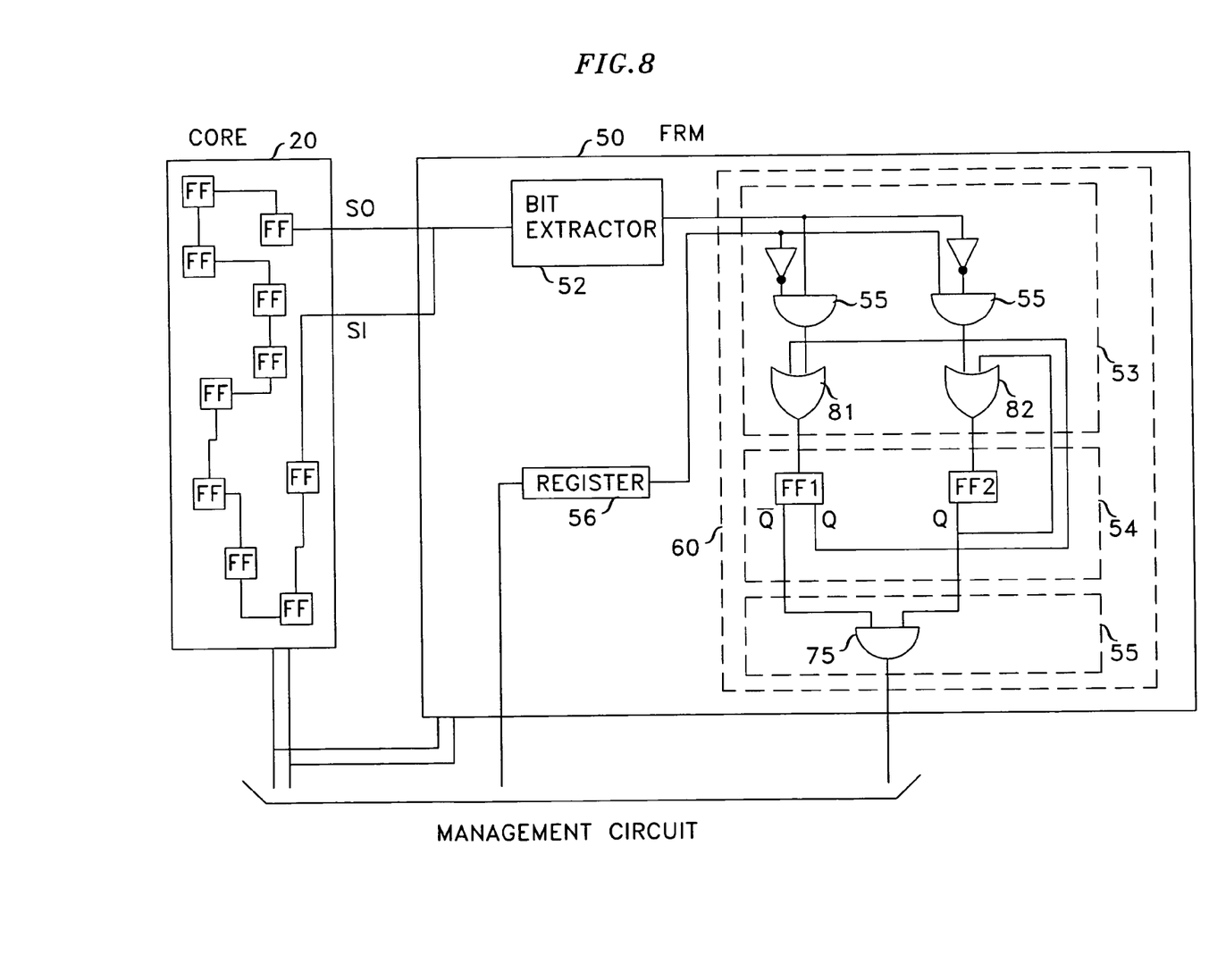
FIG. 8 illustrates a "strict set inclusion" assertion checking embodiment.

FIG. 8 presents a circuit that implements a "strict set inclusion" assertion check. If bit extractor 52 output is considered a string of bits $x_i$ and register 56 output is considered a string of bits $r_i$, then the assertion can be stated as follows: $x_i \leq r_i$ for every i, and $x_i < r_i$ for at least one i.

In operation, flip-flops FF1 and FF2 start at "0." FF1 is set at the first occurrence of $x_i \geq r_i$ and its value is locked by operation of the feedback loop through OR 81. Similarly, flip-flop FF2 is set at the first occurrence of $x_i \leq r_i$ and its value is locked by operation of the feedback loop through OR 82. The condition is met, therefore, when FF2 is set and FF1 is not set. Accordingly, AND gate 75 is responsive to the Q output of FF2 and the $\overline{Q}$ output of FF1. The assertion fires when the output of AND gate 75 is "0".

Using the nomenclature employed above, the relationships in FIG. 8 are as follows:

$$Q_1^{t+\Delta} = Q_1^t + A^t B^t$$

$$Q_2^{t+\Delta} = Q_2^t + \overline{A^t} B^t \text{ and}$$

$$O^t = \overline{Q}_1^t Q_2^t.$$

Figure 9:
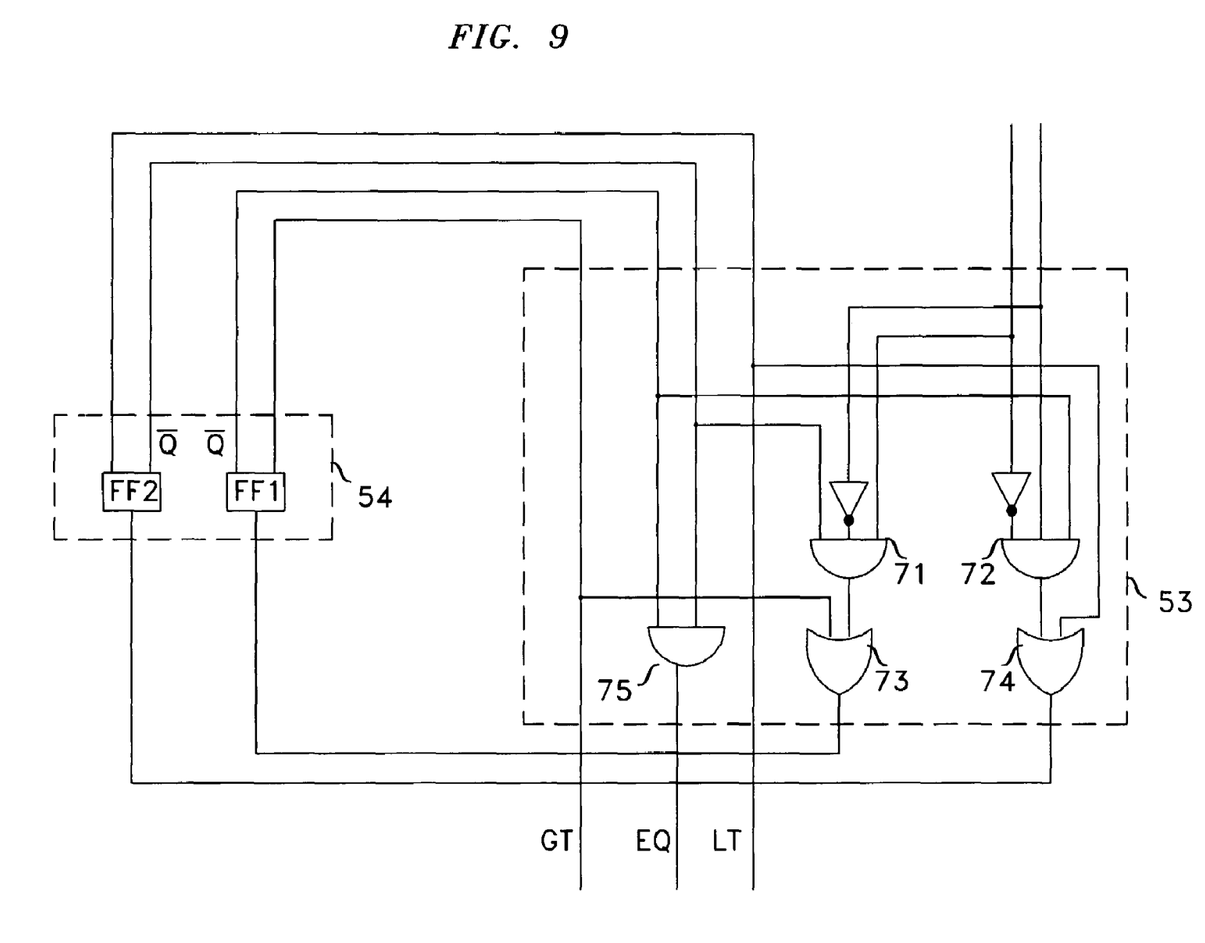
FIG. 9 illustrates alternative structure of the FIG. 8 block 60.

As indicated above, the combination of logic circuits 53 and 55 and memory module 54 can be viewed as a single sequential circuit 60, or a finite state machine 60, which can be viewed as a classical finite state machine that comprises a single logic sub-module and a single memory sub-module that is responsive to output of the logic sub-module and provides a feedback to the logic sub-module. FIG. 9 depicts the FIG. 6 element 60 in a form that includes merely one logic sub-module and one memory sub-module.

The above discloses the principles of this invention through a number of illustrations. However, it should be realized that the principles disclosed herein are broader than the specific illustrations, and that a skilled artisan would be able to employ various modifications and enhancements without departing from the spirit and scope of the instant disclosure. To illustrate, the above depictions all show a single output from bit extractor 32, and that single output is applied to a single finite state machine (sequential circuit) 60. However, it is well recognized that at each step of an SoC operation one might wish to check a plurality of assertions. In general, this plurality of assertions requires different sets of bits and, accordingly, a skilled artisan would easily realize that an advantageous embodiment of the instant invention might employ a bit extractor element that provides a plurality of different output bit streams. Those streams would each be applied to a distinct finite state machine. Of course, the plurality of finite state machines can be implemented within one finite state machine.

It is noted that FIGS. 2-9 depict various arrangements where the finite state machine is configured to check different assertions, and the above paragraph extends the teachings to the notion that a plurality of assertions can be checked concurrently by simply having a different bit stream for the bit extractor be applied to a different finite machine. It should be also noted, moreover, that since a system on a chip, is checked by alternating between mode A and mode B operations, each time mode B operation commences the finite state machine may be reconfigured to check one or more a completely different set of assertions.

The invention claimed is:

1. An integrated circuit comprising (a) at least one core, each of which contains one or more scan chains, and each of which operates in modes A and B, where in mode A said at least one core advances in its normal operation with each appearance of an operational clock pulse, and in mode B said one or more scan chains of said at least one core output a stream of bits that reflect state of memory elements in said at least one core, and (b) a functionally reconfigurable module (FRM) that is coupled to said at least one core, the improvement comprising:

a bit extractor element configured from said FRM to be responsive to said stream of bits outputted by said one or more scan chains of said at least one core, and further configured to deliver at least one stream of selected bits from said each of said stream of bits outputted by said one or more scan chains of said at least one core; and a finite state machine module configured from said FRM to be responsive to said at least one stream of selected bits, which module comprises a logic sub-module and a memory sub-module, where the logic sub-module is responsive to said at least one stream of selected bits and to one or more signals fed back from said memory sub-module, and said logic sub-module outputs one or more signals that are applied to said memory sub-module, and one or more signals that form an output of said finite state machine module.

2. The integrated circuit of claim 1 further comprising a management circuit for controlling operation of said core, said bit extractor, and said finite state machine module.

3. The integrated circuit of claim 1 where said logic sub-module is implemented as two distinct logic circuits.

4. The integrated circuit of claim 1, where said finite state machine is configured to check an preselected assertion.

5. The integrated circuit of claim 1, where said finite state machine is configured to check a plurality of assertions.

6. The integrated circuit of claim 1 where said bit extractor delivers a bit stream at N of said output terminals, and each of said bit streams relates to information necessary to check a different assertion.

7. The integrated circuit of claim 1 where said finite state machine is reconfigured from time to time to check a different set of assertions.

8. The integrated circuit of claim 1 where said finite state machine is reconfigured following occurrence of each operational clock of said integrated circuit to check a different set of assertions.

9. The integrated circuit of claim 1 where said logic sub-module is configured with logic elements and further configured to interconnect with said memory sub-module to effect "one hot" assertion checking.

10. The integrated circuit of claim 1 where said logic sub-module and memory sub-module are configured to output at said logic sub-module the signals:

$$Q_1^{t+\Delta} = A^t + Q_1^t = O_1^t$$

$$Q_2^{t+\Delta} = A^t Q_1^t + Q_2^t = O_2^t \text{ and}$$

$$O_3^t = Q_1^t \overline{Q}_2^t$$

Where $\Delta$ is a clock period, $A^t$ is a bit delivered by said bit extractor at time t, $Q_1^t$ is the True output signal of a first flip-flop of said memory sub-module, $Q_2^t$ is the True output signal of a second flip-flop of said memory sub-module at time t, $\overline{Q_2}^t$ is the complement of the True output signal of said second flip-flop of said memory sub-module at time t, $Q_1^{t+\Delta}$ is the True output signal of said first flip-flop of said memory sub-module at time t+$\Delta$ and a first output signal $O_1^t$ of said logic sub-module at time t, $Q_2^{t+\Delta}$ is the True output signal of said second flip-flop of said memory sub-module at time t+$\Delta$ and a second output signal $O_2^t$ of said logic sub-module at time t, and $Q_3^t$ is a third output signal of said logic sub-module at time t.

11. The integrated circuit of claim 1 where said logic sub-module is configured with logic elements and further configured to interconnect with said memory sub-module to effect parity assertion checking.

12. The integrated circuit of claim 1 where said logic sub-module and memory sub-module are configured to output at said logic sub-module signals $$Q^{t+\Delta}=A^t \oplus Q^t = O^t$$

Where $\Delta$ is a clock period, $A^t$ is a bit delivered by said bit extractor at time t, $Q^t$ is the True output signal of a flip-flop of said memory sub-module, $Q^{t+\Delta}$ is the True output signal of said flip-flop of said memory sub-module at time t+$\Delta$ and the finite state machine module's assertion checking output signal $O^t$ at time t.

13. The integrated circuit of claim 1 where said logic sub-module is configured with logic elements and further configured to interconnect with said memory sub-module to effect equality assertion checking between a bit string delivered by said bit extractor, and a bit string delivered by element, B.

14. The integrated circuit of claim 13 where said element B is a register, a signal derived from a second output of said bit extractor, or a signal derived from a second bit extractor.

15. The integrated circuit of claim 1 where said logic sub-module and memory sub-module are configured to output at said logic sub-module signals $$Q^{t+\Delta}=(A_1^t \oplus B^t)+Q^t = O^t,$$

where $\Delta$ is a clock period, $A^t$ is a bit delivered by said bit extractor at time t, $B^t$ is a bit delivered by a register at time t, $Q^t$ is the True output signal of a flip-flop of said memory sub-module, $Q^{t+\Delta}$ is the True output signal of said flip-flop of said memory sub-module at time t+$\Delta$ and the finite state machine module's assertion checking output signal $O^t$ at time t, at which time a bit is delivered by said bit extractor and by said register that is subsequent to a bit delivered by said bit extractor and by said register at time t.

16. The integrated circuit of claim 1 where said logic sub-module is configured with logic elements and further configured to interconnect with said memory sub-module to effect ascertain where a number, A, delivered by said bit extractor in a most-significant-bit-first order, is greater than, less than, or equal to a number, B, delivered by a register in a most-significant-bit-first order.

17. The integrated circuit of claim 1 where said logic sub-module and memory sub-module are configured to output at said logic sub-module signals $$Q_1^{t+\Delta}=Q_1^t+A^t\overline{B}^t\overline{Q_2}^t=O_1^t$$

$$Q_2^{t+\Delta}=Q_2^t+\overline{A}^tB^t\overline{Q_1}^t=O_2^t$$

$$O_3^t=Q_1^t$$

$$O_4^t=Q_2^t \text{ and}$$

$$O_5^t=\overline{Q_1}^t\overline{Q_1}^t$$

where $\Delta$ is a clock period, $A^t$ is a bit delivered by said bit extractor at time t, $\overline{A}^t$ is the complement of $A^t$, $B^t$ is a bit delivered by a register at time t, $\overline{B}^t$ is the complement of $B^t$, $Q_1^t$ is the True output signal of a first flip-flop of said memory sub-module, $\overline{Q_1}^t$ is the complement of the True output signal of said first flip-flop of said memory sub-module at time t, $Q_2^t$ is the True output signal of a second flip-flop of said memory sub-module at time t, $\overline{Q_2}^t$ is the complement of the True output signal of said second flip-flop of said memory sub-module at time t, $Q_1^{t+\Delta}$ is the True output signal of said first flip-flop of said memory sub-module at time t+$\Delta$ and a first output signal $O_1^t$ of said logic sub-module at time t, $Q_2^{t+\Delta}$ is the True output signal of said second flip-flop of said memory sub-module at time t+$\Delta$ and a second output signal $O_2^t$ of said logic sub-module at time t, and $O_3^t$, $O_4^t$, and $O_5^t$ are third, fourth, and fifth output signals, respectively, of said logic sub-module at time t.

18. The integrated circuit of claim 1 where said logic sub-module is configured with logic elements and further configured to interconnect with said memory sub-module to effect ascertain where a number, A, delivered by said bit extractor in a least-significant-bit-first order is less than a number, B, delivered in a least-significant-bit-first order.

19. The integrated circuit of claim 18 where said number B is delivered from a register, from a second output of said bit extractor, or from a second bit extractor.

20. The integrated circuit of claim 1 where said logic sub-module and memory sub-module are configured to output at said logic sub-module signals $$Q^{t+\Delta}=Q^t\overline{(A^t \oplus B^t)}+\overline{A}^tB^t=O_1^t \text{ and}$$

$$O_2^t=Q^t$$

where $\Delta$ is a clock period, $A^t$ is a bit delivered by said bit extractor at time t, $\overline{A}^t$ is the complement of $A^t$, $B^t$ is a bit delivered by a register at time t, $A^t \oplus B^t$ is the complement of $A^t \oplus B^t$, $Q^t$ is the True output signal of a flip-flop of said memory sub-module, $Q^{t+\Delta}$ is the True output signal of said flip-flop of said memory sub-module at time t+$\Delta$ and a first output signal $O_1^t$ of said logic sub-module at time t, and $O_2^t$ is a second output signal of said logic sub-module at time t.

21. The integrated circuit of claim 1 where said logic sub-module is configured with logic elements and further configured to interconnect with said memory sub-module to effect strict set inclusion assertion checking between bits delivered by said bit extractor, and respective bits delivered by a register, B.

22. The integrated circuit of claim 1 where said logic sub-module and memory sub-module are configured to output at said logic sub-module signals $$Q_1^{t+\Delta}=Q_1^t+A^t\overline{B}^t=O_1^t$$

$$Q_2^{t+\Delta}=Q_2^t+\overline{A}^tB^t=O_2^t \text{ and}$$

$$O_3^t=\overline{Q_1}^tQ_2^t$$

where $\Delta$ is a clock period, $A^t$ is a bit delivered by said bit extractor at time t, $\overline{A}^t$ is the complement of $A^t$, $B^t$ is a bit delivered by a register at time t, $\overline{B}^t$ is the complement of $B^t$, $Q_1^t$ is the True output signal of a first flip-flop of said memory sub-module, $\overline{Q_1}^t$ is the complement of the True output signal of said first flip-flop of said memory sub-module at time t, $Q_2^t$ is the True output signal of a second flip-flop of said memory sub-module at time t, $Q_1^{t+\Delta}$ is the True output signal of said first flip-flop of said memory sub-module at time $t+\Delta$ and a first output signal $O_1^t$ of said logic sub-module at time t, $Q_2^{t+\Delta}$ is the True output signal of said second flip-flop of said memory sub-module at time $t+\Delta$ and a put signal $O_2^t$ of said logic sub-module at time t, and $O_3^t$ is a third output id logic sub-module at time t.

* * * * *